United States Patent
Ha et al.

(10) Patent No.: US 7,248,499 B2
(45) Date of Patent: Jul. 24, 2007

(54) LAYOUT FOR NAND FLASH MEMORY ARRAY HAVING REDUCED WORD LINE IMPEDANCE

(75) Inventors: Chang Wan Ha, San Ramon, CA (US); Ebrahim Abedifard, Sunnyvale, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 11/480,127

(22) Filed: Jun. 30, 2006

(65) Prior Publication Data

US 2006/0250845 A1    Nov. 9, 2006

Related U.S. Application Data

(62) Division of application No. 11/097,064, filed on Apr. 1, 2005, now Pat. No. 7,170,783.

(51) Int. Cl.
G11C 5/06 (2006.01)
G11C 11/34 (2006.01)
G11C 16/08 (2006.01)

(52) U.S. Cl. .................. 365/185.11; 365/185.13; 365/51; 365/63; 365/230.03; 365/185.23

(58) Field of Classification Search ........... 365/230.03, 365/230.06, 185.11, 185.12, 63, 51, 185.17, 365/185.13, 185.23
See application file for complete search history.

(56) References Cited

U.S. PATENT DOCUMENTS

| | | | |
|---|---|---|---|
| 5,148,401 A * | 9/1992 | Sekino et al. ......... | 365/230.03 |
| 5,295,096 A | 3/1994 | Nakajima ............. | 365/185 |
| 5,319,605 A * | 6/1994 | Min et al. ............. | 365/230.06 |
| 5,345,418 A | 9/1994 | Challa ................. | 365/185 |
| 5,812,483 A * | 9/1998 | Jeon et al. ............ | 365/230.06 |
| 6,067,249 A | 5/2000 | Lee et al. ............. | 365/185.05 |
| 6,160,753 A | 12/2000 | Shibayama ............ | 365/230.06 |

(Continued)

OTHER PUBLICATIONS

Byeon, D. et al., "An 8Gb Multi-Level NAND Flash Memory with 63nm STI CMOS Process Technology", ISSCC Session 2 Non-Volatile Memory 2.2, IEEE International Solid-State Circuits Conference, Feb. 2005. pp. 46 and 47.

(Continued)

*Primary Examiner*—Amir Zarabian
*Assistant Examiner*—Michael Weinberg
(74) *Attorney, Agent, or Firm*—Dorsey & Whitney PLLP

(57) ABSTRACT

A memory array including a first region in which a first memory sub-array is located and a second region separated from the first region in which a second memory sub-array is located. The first and second memory sub-arrays have flash memory cells coupled to a plurality of word lines. A driver region separates the first and second regions and includes word line driver circuits coupled to the word lines of the first and second memory sub-arrays. A row decoder region adjacent the first region and separate from the driver region includes at least some sub-circuits of row decoder circuits located therein. The row decoder circuits are coupled to the word line driver circuits located in the driver region and are configured to activate driver circuits to drive word lines of the first and second memory sub-arrays in response to decoding address signals selecting the particular row decoder circuit.

21 Claims, 5 Drawing Sheets

U.S. PATENT DOCUMENTS

| | | | | |
|---|---|---|---|---|
| 6,370,062 | B2 | 4/2002 | Choi | 365/185.23 |
| 6,418,043 | B1* | 7/2002 | Kang | 365/145 |
| 6,529,410 | B1 | 3/2003 | Han et al. | 365/185.17 |
| 6,724,682 | B2 | 4/2004 | Lee et al. | 365/230.06 |
| 6,731,540 | B2 | 5/2004 | Lee et al. | 365/185.17 |
| 6,735,116 | B2 | 5/2004 | Lee et al. | 365/185.17 |
| 6,859,394 | B2 | 2/2005 | Matsunaga et al. | 365/185.17 |
| 2002/0126532 | A1 | 9/2002 | Matsunaga et al. | 365/185.17 |
| 2005/0122779 | A1 | 6/2005 | Fasoli et al. | 365/185.17 |
| 2005/0128807 | A1 | 6/2005 | Chen et al. | 365/185.17 |

OTHER PUBLICATIONS

Cho T. et al., "A Dual-Mode NAND Flash Memory: 1-Gb Multi-level and High-Performance 512-Mb Single-Level Modes", IEEE Journal of Solid-State Circuits, vol. 36, No. 11, Nov. 2001. pp. 1700-1706.

Hara T. et al., "A 146mm² 8Gb NAND Flash Memory with 70nm CMOS Technology", ISSCC Session 2 Non-Volatile Memory 2.1, IEEE International Solid-State Circuits Conference, Feb. 2005. pp. 44, 45 and 584.

Imamiya K. et al., "A 125-mm² 1-Gb NAND Flash Memory with 10-MByte/s Program Speed", IEEE Journal of Solid-State Circuits, vol. 37, No. 11, Nov. 2002. pp. 1493-1501.

Imamiya K. et al., "A 130-mm², 256-Mbit NAND Flash with Shallow Trench Isolation Technology", IEEE Journal of Solid-State Circuits, vol. 34, No. 11, Nov. 1999. pp. 1536-1543.

Lee J. et al., "High-Performance 1-Gb NAND Flash Memory with 0.12-µm Technology", IEEE Journal of Solid-State Circuits, vol. 37, No. 11, Nov. 2002. pp. 1502-1509.

Lee J. et al., "A 90-nm CMOS 1.8-V 2Gb NAND Flash Memory for Mass Storage Applications", IEEE Journal of Solid-State Circuits, vol. 38, No. 11, Nov. 2003. pp. 1934-1942.

Nozoe A. et al., "A 256-Mb Multilevel Flash Memory with 2-MB/s Program Rate for Mass Storage Applications", IEEE Journal of Solid-State Circuits, vol. 34, No. 11, Nov. 1999. pp. 1544-1550.

Suh K. et al., "A 3.3 V 32 Mb NAND Flash Memory with Incremental Step Pulse Programming Scheme", IEEE Journal of Solid-State Circuits, vol. 30, No. 11, Nov. 1995, pp. 1149-1156.

Takeuchi K. et al., "A Dual-Page Programming Scheme for High-Speed Multigigabit-Scale NAND Flash Memories", IEEE Journal of Solid-State Circuits, vol. 36, No. 5, May 2001. pp. 744-751.

Tanzawa T. et al., "Circuit Techniques for a 1.8-V-Only NAND Flash Memory", IEEE Journal of Solid-State Circuits, vol. 37, No. 1, Jan. 2002. pp. 84-89.

* cited by examiner

LAYOUT FOR NAND FLASH MEMORY ARRAY HAVING REDUCED WORD LINE IMPEDANCE

This application is a divisional of U.S. patent application Ser. No. 11/097,064, filed Apr. 1, 2005, now U.S. Pat. No. 7,170,783.

TECHNICAL FIELD

The invention relates generally to non-volatile memory devices, and more particularly, to the layout of a memory array for a flash memory device having a NAND flash memory architecture.

BACKGROUND OF THE INVENTION

Flash memory devices have developed into a popular source of non-volatile memory for a wide range of electronic applications. Flash memory devices typically use a one-transistor memory cell that allows for high memory densities, high reliability, and low power consumption. Common uses for flash memory include portable computers, personal digital assistants (PDAs), digital cameras, and cellular telephones. Program code, system data such as a basic input/output system (BIOS), and other firmware for a computer system can typically be stored in flash memory devices as well.

Two common types of flash memory array architectures are the "NAND" and "NOR" architectures. In the NOR array architecture, the floating gate memory cells of the memory array are arranged in a matrix. The gates of each floating gate memory cell of the array matrix are coupled by rows to word lines and their drains are coupled to column bit lines. The source of each floating gate memory cell is typically coupled to a common source line. The NOR architecture floating gate memory array is accessed by a row decoder activating a row of floating gate memory cells by selecting the word line coupled to their gates. The row of selected memory cells couple stored data values on respective column bit lines by providing differing current characteristics between the coupled source line to the coupled column bit lines corresponding to a programmed state or unprogrammed state.

A NAND array architecture also arranges its array of floating gate memory cells in a matrix having the gates of each floating gate memory cell of the array coupled by rows to word lines. However, each memory cell is not directly coupled to a source line and a column bit line. Instead, the memory cells of the array are arranged together in "strings," typically of 16 to 32 memory cells each, where the memory cells in the string are coupled together in series between a common source line and a column bit line. The NAND architecture floating gate memory array is then accessed by a row decoder activating a row of floating gate memory cells by selecting the word select line coupled to their gates. In addition, the word lines coupled to the gates of the unselected memory cells of each string are also driven. However, the unselected memory cells of each string are typically driven by a higher gate voltage in order to operate them as pass transistors to allow them to pass current in a manner that is unrestricted by their respective stored data values. Under this condition, current flows from the source line to the column bit line through each floating gate memory cell of the series coupled string, restricted only by the memory cells of each string that are selected to be accessed. As a result, the current encoded stored data values of the row of selected memory cells are coupled to the column bit lines.

FIG. 1 illustrates a conventional flash memory device 100. The flash memory device 100 has a NAND flash memory architecture. The memory device 100 includes an address interface 104, a control interface 106, and a data interface 108 through which address and control signals are received by the memory device 100 and through which data is received and provided. The flash memory device 100 further includes a control state machine 110 that directs the internal operation, such as managing the flash memory array 112 and updating RAM control registers and non-volatile erase block management registers 114. The RAM control registers 114 are utilized by the control state machine 110 during operation of the flash memory 100. The flash memory array 112 contains a sequence of memory banks or segments 116. Each memory bank 116 is organized logically into a series of erase blocks (not shown). Memory addresses are received on the address interface 104 of the flash memory 100 and divided into a row and column address portions. In response to a read access, the row address is latched and decoded by row decoder circuits 120, which select and activate a row page (not shown) of memory cells across a selected memory bank. As previously described, a row of memory corresponding to the row address is selected and the bit values encoded in the output of the selected row of memory cells are coupled from a local bit line (not shown). Sense amplifiers 122 associated with a respective memory bank 116 are coupled to the global bit line to detect the encoded bit values of the selected row of memory cells. The column address portion of the memory address is latched and decoded by column decoder circuit 124. The column decoder circuit 124 selects the desired column data from the internal data bus 125 that is coupled to the outputs of the individual read sense amplifiers 122. The column data are coupled to the data buffer 126 for transfer from the memory device through the data interface 108. On a write access the row decoder circuits 120 select the row page and the column decoder circuit 124 selects sense amplifiers 122. Data values to be written are coupled from the data buffer 126 via the internal data bus 125 to the sense amplifiers 122 selected by the column decoder circuit 124, and are written to the selected floating gate memory cells (not shown) of the memory array 112. The written cells are then reselected by the row and column decode circuits 120, 124 and sense amplifiers 122 in order to verify that the correct values have been programmed into the selected memory cells.

NAND flash memory devices are becoming popular due to the high memory densities possible at a relatively low cost. Additionally, NAND flash memory devices generally have faster program and erase times compared to NOR flash memory devices. However, a disadvantage of NAND flash memory devices compared with NOR flash memory devices is that the access time for a random access, or initial access, to the memory array is considerably longer than for a NOR flash memory device. Currently, the initial access time for a NAND flash memory device can be as much as several hundred times longer than for a NOR flash memory device. Although access times for serial accesses subsequent to the initial access are on par with NOR flash memory devices, it is still desirable to reduce the initial access time of a NAND flash memory because of the considerable time required for the initial access.

One factor that contributes to the long random access time of NAND flash memory devices is signal line impedance of word lines. As previously discussed, in accessing a row of memory cells in a NAND flash memory device, the word lines of a block of memory are driven to a relatively high voltage, except for the word line corresponding to the row being accessed. In contrast, accessing a row of memory in a NOR flash memory architecture is accomplished by driving only the word line corresponding to the row of memory being accessed. Due to the line impedance of the word lines, driving a plurality of word lines to a sufficiently high voltage in a NAND flash memory device can take considerable time. FIG. 2A illustrates a conventional layout 200 for a memory array 202 of NAND memory cells, row decoder circuits 204, and driver circuits 206. The row decoder circuits 204 decode address signals to select a row to be accessed, and the driver circuits 206 couple the word lines of the block of memory having the row to be accessed to respective global word lines 210 that carry a voltage level sufficient to drive the word lines of the block of memory. As shown in FIG. 2A, the array of NAND memory cells is arranged as 2,048 blocks of 32 word lines. The word lines extend across 32,768 (32K) bit lines, each bit line representing a column of memory cells. During an access operation, each word line in a block of memory, except for the word line corresponding to the row being accessed, must be driven along its entire length to a relatively high voltage level to perform the access operation.

Reducing the impedance of the word lines is one approach to improving the time required to drive the word lines of a block of memory. One approach is to change the physical properties of the word lines to have a lower impedance for the same length of word line. However, constraints in fabricating the NAND flash memory array often limit these design options. Another approach is to physically change the layout of the array of NAND memory cells, the row decoder circuits, and the driver circuits. FIG. 2B illustrates an alternative layout 250 that reduces the line impedance the each driver circuits 256A, 256B by changing the length of word line each driver circuit must drive. Although the layout illustrated in FIG. 2B has the same memory array capacity as shown in FIG. 2A, namely, 2,048 blocks of 32 word lines, and 32K bit lines, the array of NAND memory cells are divided into two memory sub-arrays 252A, 252B. Each memory sub-array 252A, 252B has half of the bit lines in comparison to the memory array 202 of FIG. 2A, with the word lines of each memory sub-array 252A, 252B being half as long (extending over 16K bit lines) as the word lines of the layout in FIG. 2A.

As with the layout 200 in FIG. 2A, the layout 250 includes only one set of row decoder circuits 254 for selecting the row to be accessed. However, in order to access the same number of columns of NAND memory cells as in the layout 200 of FIG. 2A, two sets of drive circuits 256A, 256B and global word lines 260A, 260B are included to drive a block of word lines in the first memory sub-array 252A and in the second memory sub-array 252B concurrently. Each drive circuit 256A, 256B drives the word lines of the respective memory sub-arrays 252A, 252B. Two sets of drive circuits 256A, 256B are used to avoid the need to form signal lines connecting the word lines of the left and right memory arrays 252A, 252B to a single set of drive circuits. Due to the density of circuits for the row decoder circuits 254, including signal lines that span the region of the row decoder circuits 254 to connect word lines of the two memory sub-arrays 252A, 252B significantly increases circuit layout complexity. In some semiconductor architectures, for example, those using polysilicon word lines, and first and second levels of metal signal lines, it is infeasible to connect two sets of word lines to one set of driver circuits using polysilicon or metal lines. Thus, in order to implement a dual-array layout, and at the very least, reduce circuit layout complexity, two sets of drive circuits 256A, 256B are used, as shown in FIG. 2B.

By reducing the length of the word lines in the layout 250 of FIG. 2B, and providing two sets of driver circuits 256A, 256B, the line impedance driven by each of the driver circuits 256A, 256B is approximately half as much as compared to the layout 200 of FIG. 2A. However, although the layout 250 of FIG. 2B provides the benefit of reducing line impedance for the driver circuits 256A, 256B, the inclusion of another set of drive circuits and global word lines will result in greater die size and increased fabrication complexity to accommodate the extra circuitry. Both results are undesirable and may be unacceptable in applications where reducing chip size and reducing fabrication complexity are priorities.

Therefore, there is a need for an alternative approach to reducing word line impedance in a flash memory device having a NAND flash memory architecture.

SUMMARY OF THE INVENTION

The present invention is directed to a layout of a memory array, row decoder circuits, and driver circuits for an array of non-volatile memory cells having a NAND flash architecture. In one aspect of the present invention, a memory array includes a first region in which a first memory sub-array is located and a second region separated from the first region in which a second memory sub-array is located. The first and second memory sub-arrays have NAND flash memory cells coupled to word lines and bit lines corresponding to rows and columns of memory cells. The memory array further includes a driver region in which word line driver circuits are located. The driver region is separates the first and second regions, and the word line drivers are coupled to the word lines from the first memory sub-array and the word lines from the second memory sub-array. A row decoder region adjacent the first region and separate from the driver region includes at least some sub-circuits of row decoder circuits located therein. The row decoder circuits are coupled to the word line driver circuits located in the driver region and are configured to activate driver circuits to drive word lines of the first and second memory sub-arrays in response to decoding address signals selecting the particular row decoder circuit.

DETAILED DESCRIPTION OF PREFERRED EMBODIMENTS

Certain details are set forth below to provide a sufficient understanding of the invention. However, it will be clear to one skilled in the art that the invention may be practiced without these particular details. Moreover, the particular embodiments of the present invention described herein are provided by way of example and should not be used to limit the scope of the invention to these particular embodiments. In other instances, well-known circuits, control signals, and timing protocols have not been shown in detail in order to avoid unnecessarily obscuring the invention.

Figure 3:
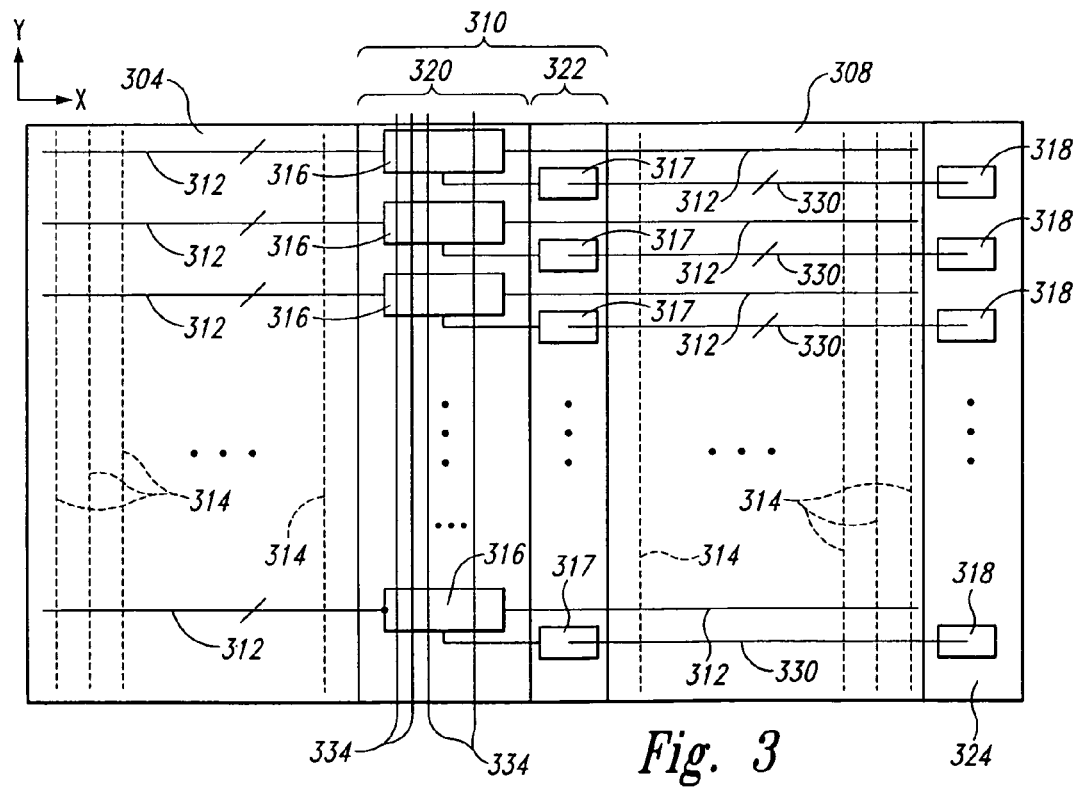
FIG. 3 is a layout diagram for a NAND flash memory array, row decoder circuits and driver circuits according to an embodiment of the present invention.

FIG. 3 is a block diagram of a layout for a NAND flash memory array, row decoder circuits, and driver circuits according to an embodiment of the present invention. The NAND flash memory cells (not shown) are arranged in rows and columns of memory cells in memory sub-arrays 304, 308. The rows of memory cells correspond to word lines 312 and the columns of memory cells correspond to bit lines 314. As shown in FIG. 3, the word lines 312 run in the "X" direction and the bit lines 314 run in the "Y" direction. Each of the word lines 312 in FIG. 3 represents 32 word lines of a "memory block," and each memory sub-array 304, 308 includes 2048 memory blocks. Each memory sub-array includes 16,384 (16K) bit lines 314 that intersect the 2048× 32 word lines.

The memory sub-arrays 304, 308 are arranged on opposite sides of a region 310 that includes a driver region 320 in which drive circuits 316 for driving the word lines 312 of the memory sub-arrays 304, 308 are located and further includes a first row decoder region 322 in which first row decoder sub-circuits 317 are located. The first row decoder sub-circuits 317 are coupled to the drive circuits 316. A second row decoder region 324 in which second row decoder sub-circuits 318 are formed is located in a separate region from the first row decoder region 322. As shown in FIG. 3, the second row decoder region 324 is formed on an opposite side of the memory sub-array 308 from the first row decoder region 322. Each second row decoder sub-circuit 318 is coupled to a respective first row decoder sub-circuit 317 by conductive signal lines 330 which extend across the memory sub-array 308. The signal line 330 in FIG. 3 represents at least one conductive signal line coupling a second row decoder sub-circuit 318 to a first row decoder sub-circuit. The number of actual conductive signal lines can vary without departing from the scope of the present invention. The number of actual conductive signal lines between the first and second row decoder sub-circuits 317, 318 will depend on the division of row decoder circuitry between the first row decoder region 322 and the second row decoder region 324. Alternative forms of coupling the first and second row decoder sub-circuits 317, 318 can be used as well without departing from the scope of the present invention. The first row decoder circuits 317 are further coupled to activate the drive circuits 316 to drive the word lines of a memory block, with each drive circuit 316 coupled to a set of global word lines 334 that provide drive voltage to drive the word lines 312.

In the present example, there are 2,048 first row decoder sub-circuits 317 located in the first row decoder region 322, each of which is coupled to a respective one of 2,048 second row decoder sub-circuits 318 located in the second row decoder region 324. The 2,048 first row decoder sub-circuits 317 are further coupled to activate one of the 2,048 drive circuits 316 to drive the 32 word lines of one of the 2,048 memory blocks. As previously discussed, all the word lines 312 of a block of memory, except for the word line corresponding to the row of memory being accessed, are driven to a relatively high-voltage, and the word line of the row being accessed is driven to a lower access voltage level. Thus, for the 32 word lines of a memory block, 31 word lines are driven to a relatively high-voltage and one word line is driven to an access voltage level. When activated, the drive circuit 316 is coupled to drive the 32 word lines of a memory block in the memory sub-array 304 and the 32 word lines of a memory block in the memory sub-array 308. The drive circuits 316 are coupled to 32 global word lines 334 to provide the power the drive the 32 word lines when activated.

In operation, a row address is decoded to select one of the 2,048 second row decoder sub-circuits 318. Conventional decoding logic can be utilized to decode the address to select one of the second row decoder sub-circuits 318. Upon selection following the row address decode process, the second row decoder sub-circuit 318 generates pump activation signals PUMP1, PUMP2 that are provided to the respective first row decoder sub-circuit 317. The PUMP1, PUMP2 signals have logic levels that correspond to a voltage that is between a voltage supply level VCC and ground. Typically a HIGH logic level is represented by a voltage between a first threshold and VCC, and a LOW logic level is represented by a voltage between a second threshold (less than the first threshold) and ground, as known in the art.

In response to receiving the PUMP1, PUMP2 signals, a local charge pump of the respective first row decoder sub-circuit 317 generates a driver circuit enable signal VPASS having a voltage in excess of VCC. As will be explained in more detail below, the VPASS signal is used to activate n-channel metal-oxide-semiconductor ("NMOS") selection transistors that couple the global word lines 334 to the word lines 312 of a selected memory block. A VPASS signal having a voltage in excess of VCC is desirable in order to fully couple a VCC voltage from the global word lines 334 to the word lines 312, as known in the art. Where an alternative drive circuit 316 is utilized, or the desire to fully couple the VCC voltage from the global word lines 334 to the word lines 312 is not significant, the VPASS signal can have a voltage that does not exceed VCC.

As previously discussed, the VPASS signal that is generated by the first row decoder sub-circuit 317 is applied to the gates of selection transistors to couple the global word lines 334 to the word lines 312 of the selected memory blocks in the memory sub-arrays 304, 308. As a result, the word lines 312 for the strings of NAND flash memory cells of the selected memory block are driven to the voltage of the global word lines 334. The voltage of the global word lines 334 is typically VCC. However, in alternative embodiments, the voltage of the global word lines 334 can be greater than VCC as well. Where the voltage of the global word lines 334 is greater than VCC, the voltage of the VPASS signal should also be adjusted to allow the voltage of the global word lines 334 to be fully coupled to the word lines 312. Following the activation of the word lines 312 of the memory blocks in the memory sub-arrays 304, 308, the programmed state of the selected memory cell is sensed and amplified by a set of sense amplifiers (not shown) coupled to the bit lines 314 to determine the stored data state, as previously discussed.

Figure 1:
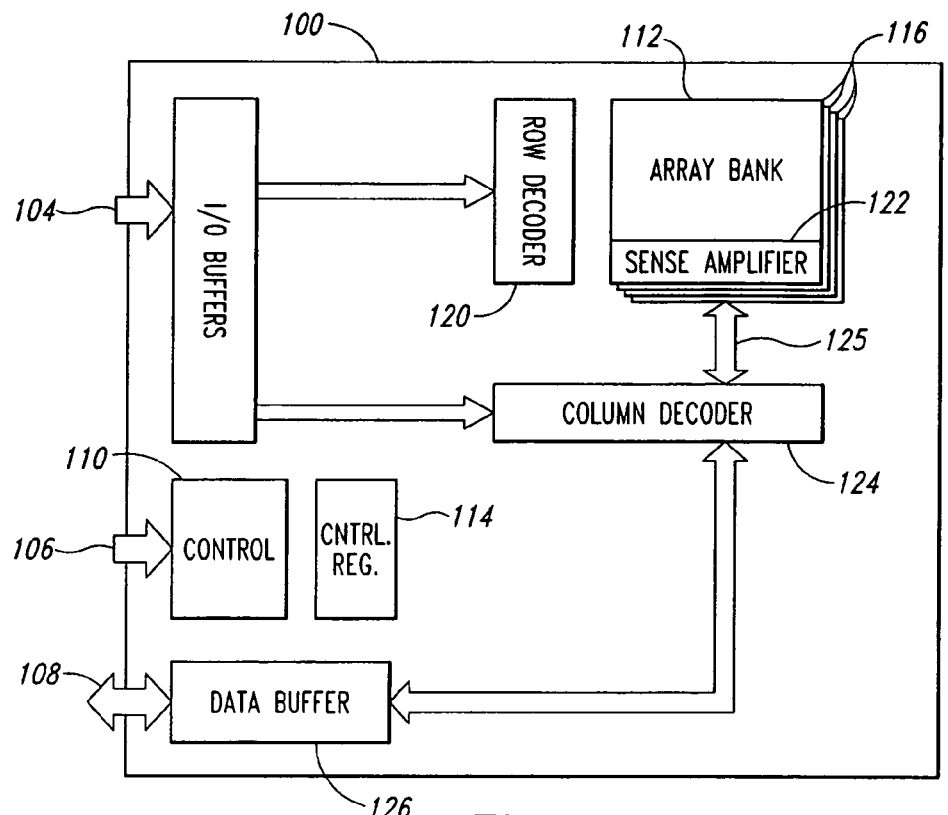
FIG. 1 is a block diagram of a conventional flash memory device having a NAND flash memory architecture.

As shown in FIG. 3, the drive circuits 316 are generally centrally located in the region 310, and drive two sets of word lines that are approximately the same length, namely, word lines 312 in the memory sub-array 304 and word lines 312 in the memory sub-array 308. Thus, in comparison to the conventional layout illustrated in FIG. 1, the word lines 312 of the layout illustrated in FIG. 3 have approximately one-half of the impedance of the word lines 112. As a result, the speed of driving the word lines 312, assuming drive circuits of similar drive capability, will be significantly lower when compared to driving the word lines 112.

Figure 2A:
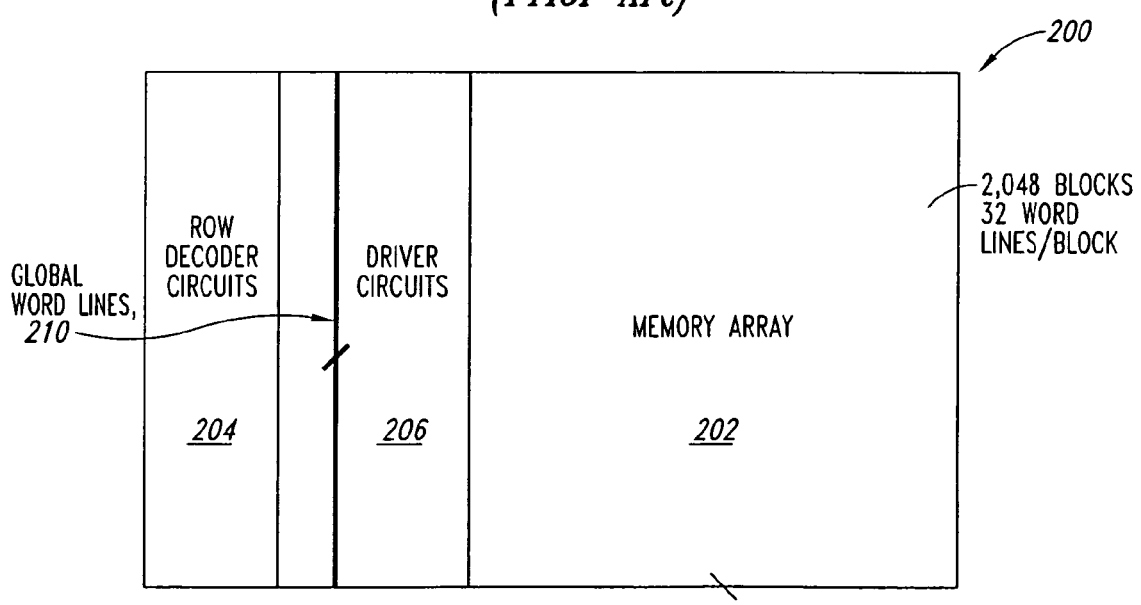
FIG. 2A is a layout diagram for a conventional NAND flash memory array, row decoder circuits, and driver circuits.
Figure 2B:
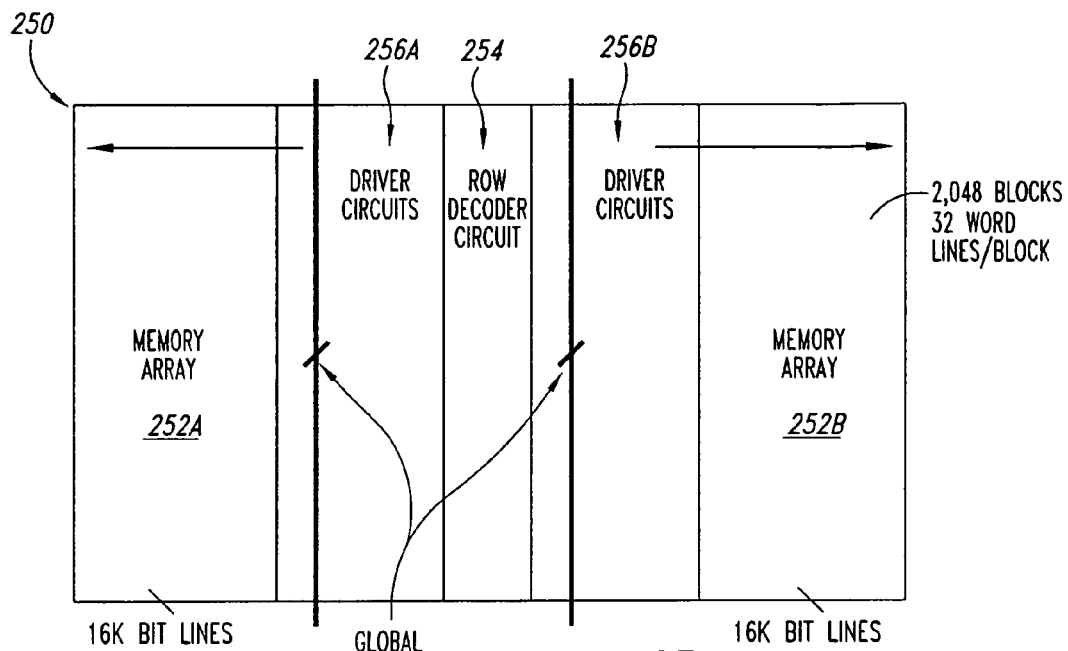
FIG. 2B is a layout diagram for an alternative conventional NAND flash memory array, row decoder circuits, and driver circuits.

Although the conventional layout 250 illustrated in FIG. 2B provides two memory sub-arrays 204, 208 having word lines 212 approximately half the length of the word lines 112, similar to the layout of FIG. 3, as previously discussed, the layout 250 of FIG. 2B includes two sets of driver circuits 256A, 256B, and a set of row decoders 254 centrally located between the memory sub-arrays 204, 208. In contrast to the layout 250 of FIG. 2B, the layout of FIG. 3 provides that at least one portion of a row decoder circuit is located in a region separated from the region in which the drive circuits are located. In the layout of FIG. 3, one set of centrally located drive circuits 316 having sufficient drive capability to drive word lines 312 of the memory sub-array 304 and the memory sub-array 308 in the region 310 can be used, as compared to the two sets of drive circuits 216A, 216B that drive respective word lines 212 of the memory sub-arrays 204, 208. Locating at least one part of the row decoder circuits away from the region 310 facilitates the utilization of drive circuits 316 having greater drive capability than the drive circuits 216 of the layout 250 illustrated in FIG. 2B.

Alternatively, two sets of drive circuits can be located in the driver region 320. However, instead of locating the two sets of drive circuits on opposite sides of a set of row decoder circuits, as in the layout 250 of FIG. 2B, the two sets of drive circuits are designed to share several common circuit elements, to the extent possible, in order to reduce the space occupied by the drive circuits. That is, due to the proximity of the two sets of drive circuits located in the same driver region 320, and without the circuitry of full row decoder circuits, less space can be occupied in comparison to the two sets of drive circuits 216A, 216B shown in layout 250 of FIG. 2B. Designing and laying out two sets of driver circuits that share common circuit elements is known in the art, and further description of such will be omitted herein in the interest of brevity.

Figure 7:
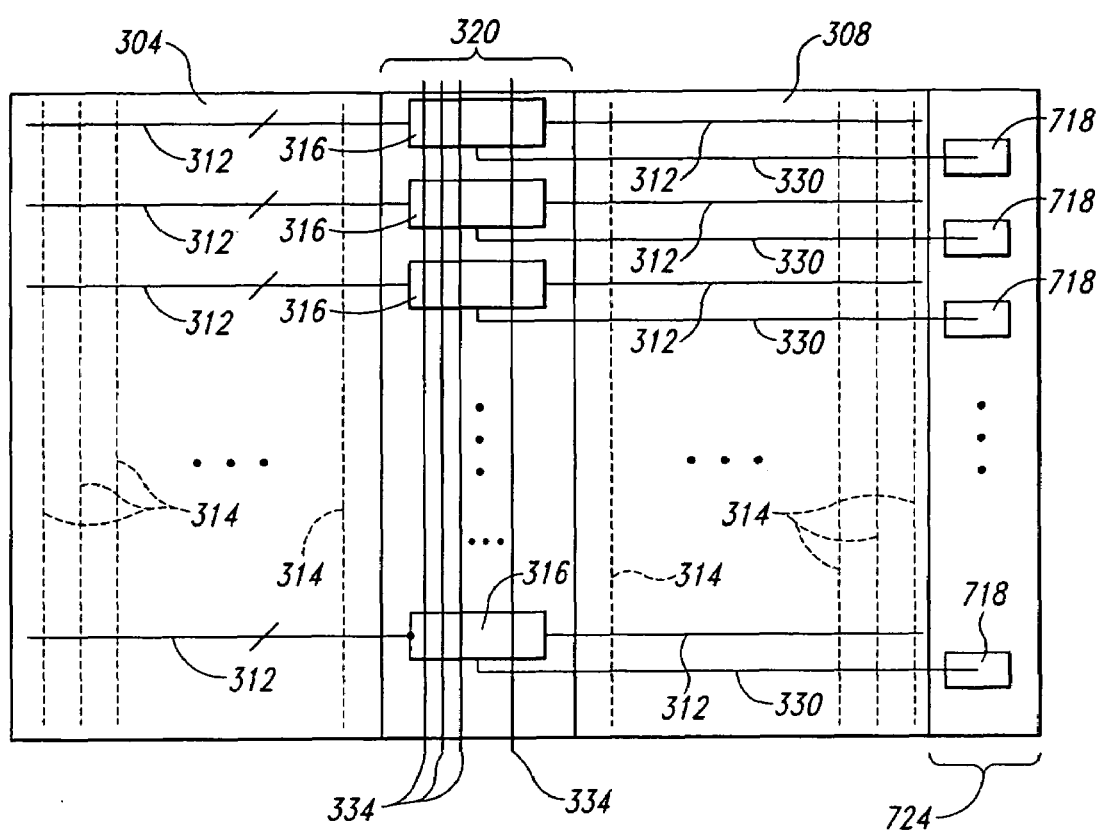
FIG. 7 is a layout diagram for a NAND flash memory array, row decoder circuits and driver circuits according to another embodiment of the present invention.

In the particular embodiment shown in FIG. 3, row decoder circuits are divided into first and second row decoder sub-circuits 317, 318. However, in alternative embodiments, full row decoder circuits can be located in a region separated from the driver region 320. FIG. 7 illustrates a layout for a NAND flash memory array according to an embodiment in which the row decoder circuits 718 are located in a region 724 that is separate from the driver region 320. In contrast to the layout shown in FIG. 3, the row decoder circuits 718 shown in FIG. 7 are not split into first and second sub-circuits. The layout of FIG. 7 will be described in greater detail below.

Circuit layout complexity can be reduced by locating the row decoder circuitry in two separate regions, or entirely in a region separate from the driver circuits. As previously discussed, the density of circuitry for row decoder circuits can limit the circuit layout of other circuits. Unlike the conventional layouts illustrated in FIGS. 2A and 2B, for the layouts shown in FIGS. 3 and 7, the row decoder circuits, or at least a portion thereof, have been moved to a region separate from the driver region 320 in which the drive circuits 316 are located. As a result, the word lines 312 from both the memory sub-arrays 304, 308 can be coupled to the respective drive circuits 316 without being impeded by the density of circuitry for the row decoder circuits. That is, by locating at least a portion of the row decoder circuitry in a region separate from the region where the drive circuits 316 are formed, the density of circuits in that region is reduced, and allows for that space to be advantageously used for coupling the word lines 312 to the drive circuits 316. Although the row decoder circuitry is divided into first decoder sub-circuits 317 and second row decoder sub-circuits 318 in the layout of FIG. 3, the circuit layout of the row decoder circuitry can be a consideration in dividing the row decoder circuitry between a generally central region and a region separate from the region in which the driver circuits are located in order to advantageously reduce fabrication complexity.

Figure 4:
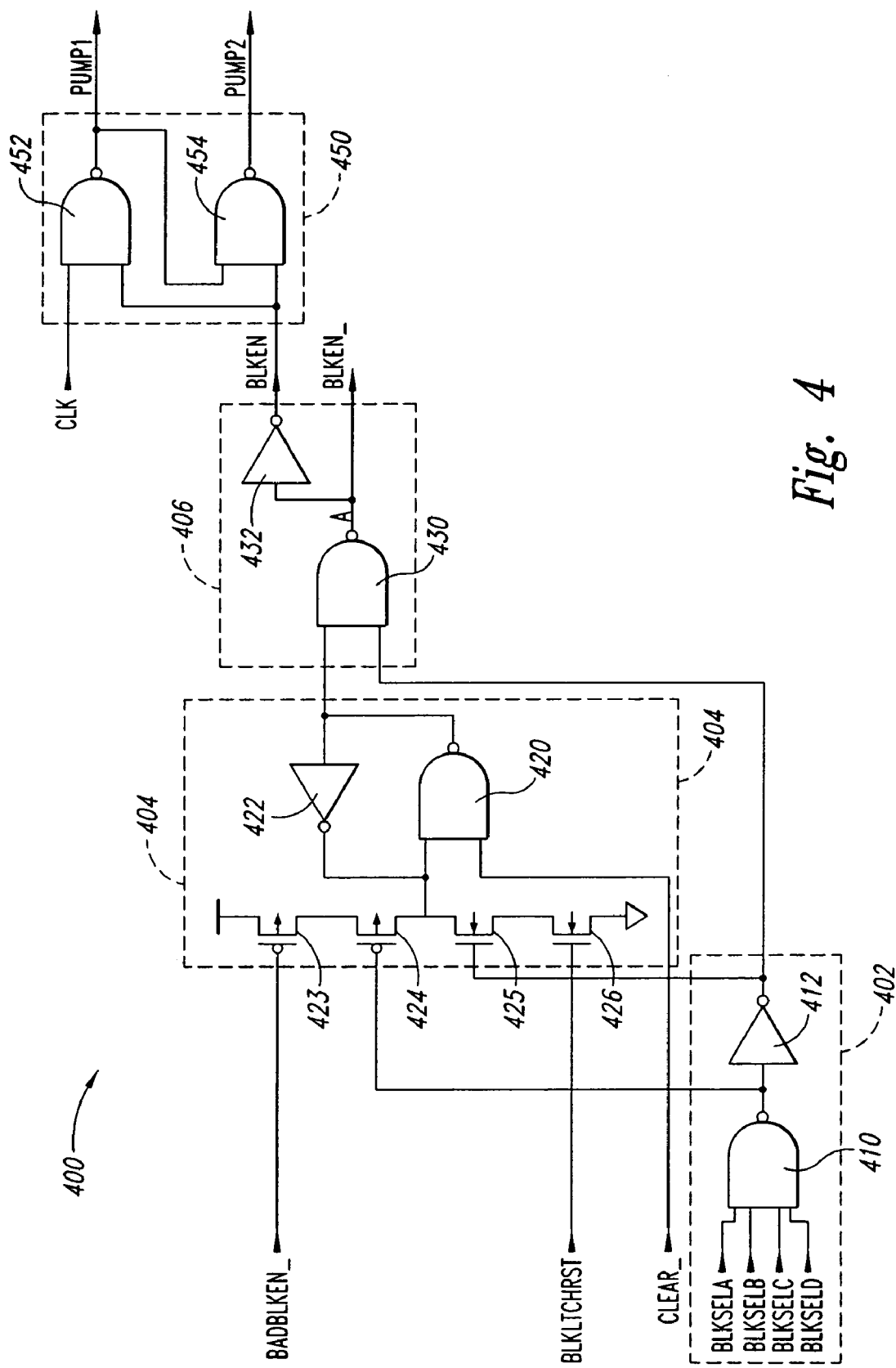
FIG. 4 is a schematic diagram for a row decoder sub-circuit according to an embodiment of the present invention.

FIG. 4 illustrates a second row decoder sub-circuit 400 that can be used in embodiments of the present invention. The second row decoder sub-circuit 400 includes block decoder logic 402, bad-block logic 404, and block enable logic 406. The second row decoder sub-circuit 400 further includes a voltage pump pre-stage 450 that is enabled by a block enable signal BLKEN having a HIGH logic level.

The block decoder logic 402 receives predecoded address signals BLKSELA-BLKSELn, where "n" is an integer value. A NAND logic gate 410 coupled to receive the BLKSELA-BLKSELn signals generates an output signal having a LOW logic level in response to the BLKSELA-BLKSELn signals all having a HIGH logic level. That is, selection of a particular second row decoder sub-circuit 400 is accomplished by generating a plurality of predecoded address signals from external address signals where only one set of the predecoded address signals has all signals with a HIGH logic level. The predecoded address signals BLKSELA-BLKSELn applied to the second row decoder sub-circuit 400 can be generated using conventional address predecode circuits known in the art.

In response to the NAND gate 410 generating a LOW output signal, an inverter 412 generates an output signal having a HIGH logic level, which is provided to a first input of a NAND gate 430 in the block enable logic 406. The bad-block logic 404 is used to identify memory blocks that have defective NAND flash cells, or is otherwise defective and cannot be used to storing data. The bad-block logic 404 includes a latch formed from a NAND gate 420 and an inverter 422, and further includes PMOS transistors 423, 424 and NMOS transistors 425, 426 coupled between a voltage supply and ground.

A first input of the NAND gate 420 receives a data clear signal CLEAR_ which is used to force the latch to latch a HIGH logic level in response to a CLEAR_signal having a LOW logic level. However, when the CLEAR_signal has a HIGH logic level, the latch will latch a logic level according to a logic level applied to a second input of the NAND gate 420. As previously discussed, in response to all the predecode signals BLKSELA-BLKSELn having a HIGH logic level, the NAND gate 410 generates a LOW output signal and the inverter 412 generates a HIGH output signal. The PMOS transistor 424 and the NMOS transistor 425 are switched ON by the output of the NAND gate 410 and the output of the inverter 412, respectively.

Initially, the bad-block logic is reset to provide an output signal having a HIGH logic through the use of a block latch reset signal BLKLTCHRST applied to the NMOS transistor 426 having a HIGH logic level. In response the second input of the NAND gate 420 is coupled to ground through the NMOS transistors 425, 426, which in combination with the HIGH CLEAR_signal, causes the NAND gate 420 to generate a HIGH output signal. The HIGH output signal is latched through the inverter 422 generating a LOW output signal that is fed back to the second input of the NAND gate 420. Assuming that the memory block selected by the second row decoder sub-circuit 400 is functional, the output signal of the NAND gate 420 has a HIGH logic level. The HIGH output signal of the bad-block logic 404 in combination with the HIGH output signal of the block decoder logic 402 causes the NAND gate 430 of the block enable logic 406 to generate a LOW (active LOW) BLKEN_, which is then inverted by an inverter 406 to generate a HIGH (active HIGH) block enable signal BLKEN.

In response to the HIGH BLKEN signal, the voltage pump pre-stage 450 is enabled to generate pump signals PUMP1, PUMP2, which are used by a voltage pump in a first row decoder sub-circuit located in the first row decoder region 322 (FIG. 3) The HIGH BLKEN signal is provided to a first input of NAND gates 452, 454, which results in the NAND gates 452, 454 functioning as inverters to generate output signals that have complimentary logic levels to a signal applied to a second input. The second input of the NAND gate 452 is coupled to receive a clock signal CLK, which is a periodic signal oscillating between HIGH and LOW logic levels. As a result, the PUMP1 signal output by the NAND gate 452 is an inverted version of the CLK signal and the PUMP2 signal output by the NAND gate 454 is an inverted version of the PUMP1 signal. As previously mentioned, the PUMP1, PUMP2 signals are provided to a respective first row decoder sub-circuits 317 that activates a drive circuit to drive the word lines of the selected memory block of the memory sub-arrays 304, 308.

The bad-block logic 404 is used to identify a bad memory block by providing a bad-block enable signal BADBLKEN_ having a LOW logic level to the PMOS transistor 423. As a result, the second input of the NAND gate 420 is coupled to a voltage supply, which in combination with the HIGH CLEAR_signal, causes the NAND gate 420 to generate an output signal having a LOW logic level. The LOW signal is latched through the inverter 422 generating a HIGH output signal fed back to the second input of the NAND gate 420. The LOW output signal of the NAND gate 420 forces the NAND gate 430 to generate only a HIGH (inactive) BLKEN_signal and the inverter 432 to generate a LOW (inactive) BLKEN signal. As a result, even if the output of the block decoder logic 402 is LOW, indicating that the particular second row decoder sub-circuit 400 has been selected by the predecode signals BLKSELA-BLKSELn, the bad-block logic prevents an active BLKEN signal from being generated. The LOW BLKEN signal applied to the NAND gates 452, 454 cases the PUMP1 and PUMP2 signals to be held at a HIGH logic level, regardless of the logic state of the CLK signal. Thus, the first row decoder circuits 317 are not activated by the PUMP1 and PUMP2 signals.

Figure 5:
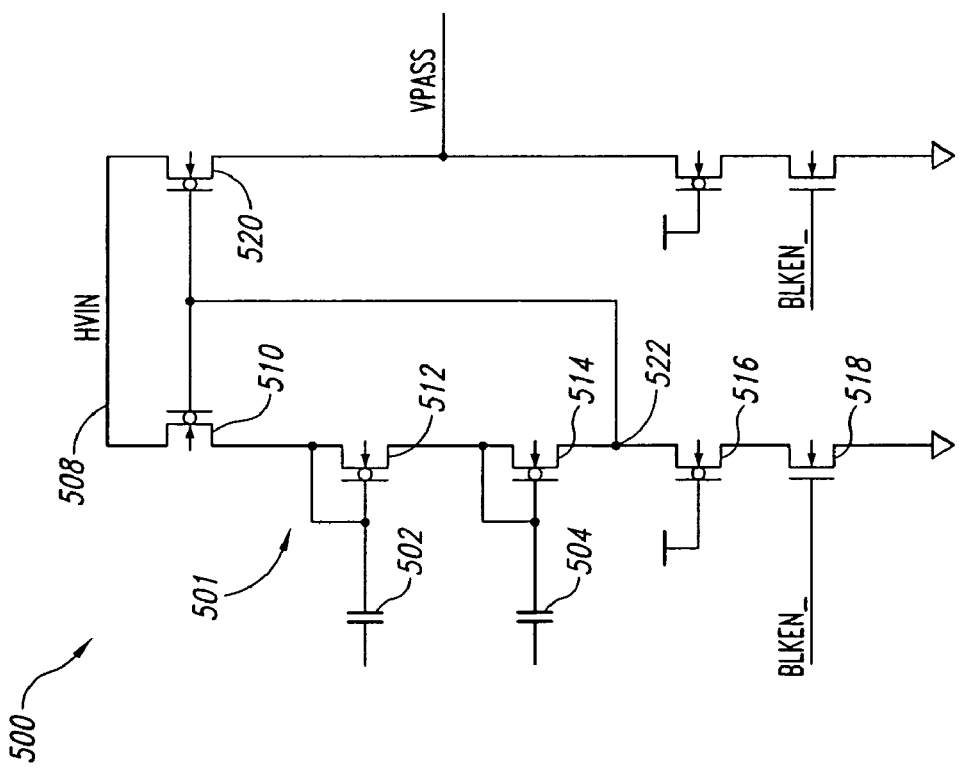
FIG. 5 is a schematic diagram for a of a row decoder sub-circuit according to an embodiment of the present invention for use with the row decoder sub-circuit of FIG. 4.

FIG. 5 illustrates a first row decoder sub-circuit 500 according to an embodiment of the present invention. The first row decoder sub-circuit 500 is a two-phase voltage pump that generates an output voltage VPASS that is greater than a supply voltage. Input pump signals PUMP1, PUMP2 are applied to a first node of respective charge capacitors 502, 504. As previously discussed with respect to the second row decoder sub-circuit 400 of FIG. 4, the PUMP1, PUMP2 signals are oscillating signals when the second row decoder sub-circuit 400 is selected by predecode signals BLKSELA-BLKSELn and the bad-block logic 404 has not been set to a bad-block condition. Otherwise, the PUMP1 and PUMP2 signals remain at either a HIGH or LOW logic level. A high-voltage pump 501 having zero or low VT NMOS transistors 510, 512, 514, 516, and NMOS transistor 518 are coupled in series between a high-voltage node 508 and ground. The NMOS transistor 518, having a gate to which an active LOW BLKEN_signal is applied, is provided to discharge a node 522 when the first row decoder sub-circuit 500 is not enabled. The oscillating PUMP1, PUMP2 signals when applied to the first nodes of the charge capacitors 502, 504 result in a voltage increase on a second node of the charge capacitors 502, 504. The second nodes of the charge capacitors are coupled to the zero-VT NMOS transistors 512, 514 respectively. As the PUMP1 and PUMP2 signals oscillate, the voltage at the gates and drains of the zero-VT NMOS transistors 512, 514 are "pumped." Since the node 522 and the drains of the zero-VT NMOS transistors 512, 514 are floating, that is, there is no current path for the pumped charge to discharge to ground, the voltage at the node 522 and the drains of the zero-VT NMOS transistors 512, 514 continue to increase, eventually driving the voltage at the high-voltage node 508 to a voltage that exceeds a supply voltage. The voltage at the high-voltage node 508 is in turn provided through the zero-VT NMOS transistor 520, having a gate coupled to the node 522, as the high-voltage VPASS signal. As previously described, in one embodiment the VPASS signal is applied to gates of NMOS selection transistors of the drive circuit 316 (FIG. 3) which couple the global word lines 334 to the word lines 312 of a selected memory block. When the first row decoder sub-circuit 500 is not enabled, that is, the BLKEN signal is LOW and the BLKEN_signal is HIGH and the PUMP1 and PUMP2 signals are constant, the high-voltage node 508 and the node 522 are discharged to ground through the zero-VT NMOS transistor 516 and the NMOS transistor 518, as previously discussed.

Figure 6:
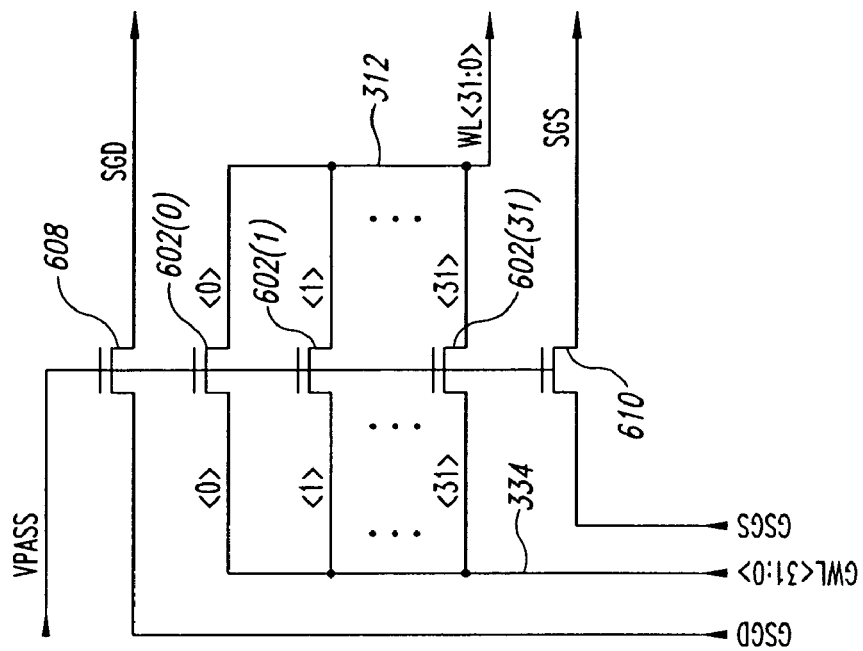
FIG. 6 is a schematic diagram for a string driver according to an embodiment of the present invention for use with the row decoder sub-circuits of FIGS. 4 and 5.

FIG. 6 illustrates a drive circuit 600 according to an embodiment of the present invention. The drive circuit 600 includes a plurality of NMOS transistors 502(0)–502(n) that couple global word lines 334(0)–334(n) to word lines 312(0)–312(n). The word lines 312(0)–312(n) correspond to the word lines of the selected memory blocks of memory sub-arrays 304, 308. As shown in FIG. 6, n=31 indicating that in the present example, there are 32 NMOS transistors 502 to couple 32 global word lines 334 to 32 word lines 312. However, "n" has been used to illustrate that the specific number of NMOS transistors 502, global word lines 334, and word lines is not limited to a particular number, and can be modified from the specific example of FIG. 6 without departing from the scope of the present invention.

A high-voltage selection signal VPASS is applied to the gates of the NMOS transistors 502(0)–502(n). As previously discussed, the VPASS signal has a voltage that is greater than the supply voltage, and more generally, greater than the voltage of the global word lines 334(0)–334(n), in order to fully couple the voltage of the global word lines 334(0)–334(n) to the word lines 312(0)–312(n). The word lines 312(0)–312(n) are coupled to the gates of n NAND flash cells (not shown) of a NAND string of memory, which are driven by the voltage of the global word lines 334(0)–334(n) to access a row of memory corresponding to a memory address, as previously discussed. The VPASS signal is further provided to the gates of NMOS transistors 508 and 510, which couple a bit-side gate signal SGD and a source-side gate signal SGS, respectively, to gates of NMOS transistors (not shown) that are used to couple a string of NAND flash memory cells to a bit line 314 and a source line, as known in the art.

As previously mentioned, FIG. 7 illustrates a layout for a NAND flash memory array according to an embodiment in which the row decoder circuits 718 are located in a region 724 which is separate from the driver region 320. Elements previously described with respect to the layout shown in FIG. 3 are referenced in FIG. 7 using the same reference numbers. The row decoder circuits 718 are coupled to a respective drive circuit 316 by a conductive signal line 330. With reference to the row decoder sub-circuits and the drive circuit shown in FIGS. 4–6, a row decoder circuit 718 can be represented by the first and second row decoder sub-circuits 500 and 400 formed together in the region 724. Each row decoder circuit 718 is coupled to a respective driver circuit 316, which can be represented by the drive circuit 600, by the signal line 330. In an embodiment that utilizes the first and second row decoder sub-circuits 500 and 400 and the drive circuit 600, operation of the NAND memory having a layout as that shown in FIG. 7 is similar as previously described for the layout of FIG. 3, except for minor variations which can be understood by those ordinarily skilled in the art. For example, in the layout of FIG. 7, the VPASS signal is provided on the signal lines 330 from a row decoder circuit 718 to a respective drive circuit 316, instead of the PUMP1 and PUMP2 signals from the second row decoder sub-circuits 318 to a respective first row decoder sub-circuit 317.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A memory array for a non-volatile memory device, the memory array comprising:
   a first region in which a first memory sub-array is located, the first memory sub-array having NAND flash memory cells coupled to word lines and bit lines corresponding to rows and columns of memory cells;
   a second region separated from the first region in which a second memory sub-array is located, the second memory sub-array having NAND flash memory cells coupled to word lines and bit lines corresponding to rows and columns of memory cells;
   a driver region in which word line driver circuits and first row decoder sub-circuits are located, the driver region separating the first and second regions, the word line drivers coupled to the word lines from the first memory sub-array and the word lines from the second memory sub-array and configured to drive the respective word lines responsive to a drive signal and each first row decoder sub-circuit configured to generate a drive signal for a respective word line driver circuits responsive to an enable signal; and
   a row decoder region in which row decoder circuits are located, the row decoder region adjacent the first region and separated from the driver region by the first region, each row decoder circuit including a second row decoder sub-circuit coupled to a respective first row decoder sub-circuit and configured to generate the enable signal in response to decoding address signals selecting the particular row decoder circuit.

2. The memory array of claim 1 wherein each of the word line drivers is coupled to at least one word line of the first memory sub-array and at least one word line of the second memory sub-array.

3. The memory array of claim 1, further comprising a plurality of global word lines and wherein the plurality of word line driver circuits are coupled to the plurality of global word lines, each word line driver circuit configured to couple a respective word line to a global word line in response to an activation signal from a respective row decoder circuit coupled to the word line driver circuit.

4. The memory array of claim 1, further comprising a plurality of conductive signal lines coupling the first row decoder sub-circuits to the second row decoder sub-circuits extending across the first region.

5. The memory array of claim 1 wherein each of the second row decoder sub-circuits comprises:
   address decode logic having address input nodes to which address predecode signals are applied, the address decode logic configured to generate an activation signal in response to receiving address predecode signals selecting the row decoder circuit; and
   block enable logic coupled to the address decode logic and configured to generate a block enable signal responsive to the activation signal.

6. The memory array of claim 5 wherein each of the first row decoder sub-circuits comprises a voltage pump circuit having an input at which the block enable signal is applied, the voltage pump circuit configured to generate drive signals for the word line driver circuits responsive to the block enable signal.

7. The memory array of claim 6 wherein each of the second row decoder sub-circuits further comprises a voltage pump circuit pre-stage coupled to the block enable logic and configured to generate a periodic pump signal responsive to the block enable signal and wherein the voltage pump circuit comprises a voltage pump configured to generate the drive signal responsive the periodic pump signal.

8. The memory array of claim 6 wherein each word line driver circuit comprises N switches coupled to N global word lines and N word lines of the first and second pluralities of word lines, each of the N switches having a control node coupled to the drive signal and configured to couple the respective global word line to the respective word line responsive to the drive signal.

9. A non-volatile memory device, comprising:
   a command decoder operable to decode a plurality of command signals applied to respective external command terminals of the non-volatile memory device, the command decoder further operable to generate control signals corresponding to the decoded command signals;
   an address circuit operable to receive a memory address;
   a memory array of non-volatile memory cells, the memory array comprising:
      a first region in which a first memory sub-array is located, the first memory sub-array having NAND flash memory cells coupled to word lines and bit lines corresponding to rows and columns of memory cells;
      a second region separated from the first region in which a second memory sub-array is located, the second memory sub-array having NAND flash memory cells coupled to word lines and bit lines corresponding to rows and columns of memory cells;
      a driver region in which word line driver circuits and first row decoder sub-circuits are located, the driver region separating the first and second regions, the word line drivers coupled to the word lines from the first memory sub-array and the word lines from the second memory sub-array and configured to drive the respective word lines responsive to a drive signal and each first row decoder sub-circuit configured to generate a drive signal for a respective word line driver circuits responsive to an enable signal; and a row decoder region in which row decoder circuits coupled to the address circuit are located, the row decoder region adjacent the first region and separated from the driver region by the first region, each row decoder circuit including a second row decoder sub-circuit coupled to a respective first row decoder sub-circuit and configured to generate the enable signal in response to decoding address signals selecting the particular row decoder circuit, a column decoder coupled to the memory array and operable to access a selected column page from the memory array; and a read data path circuit coupled to the column decoder and operable to couple read data signals from the memory cell array to external data terminals of the memory device.

10. The non-volatile memory device of claim 9 wherein each of the word line drivers of the memory array is coupled to at least one word line of the first memory sub-array and at least one word line of the second memory sub-array.

11. The non-volatile memory device of claim 9 wherein the memory array further comprises a plurality of global word lines and wherein the plurality of word line driver circuits are coupled to the plurality of global word lines, each word line driver circuit configured to couple a respective word line to a global word line in response to an activation signal from a respective row decoder circuit coupled to the word line driver circuit.

12. The non-volatile memory device of claim 9 wherein the memory array further comprises a plurality of conductive signal lines coupling the first row decoder sub-circuits to the second row decoder sub-circuits extending across the first region.

13. The non-volatile memory device of claim 9 wherein each of the second row decoder sub-circuits of the memory array comprises:

address decode logic having address input nodes to which address predecode signals are applied, the address decode logic configured to generate an activation signal in response to receiving address predecode signals selecting the row decoder circuit; and block enable logic coupled to the address decode logic and configured to generate a block enable signal responsive to the activation signal.

14. The non-volatile memory device of claim 13 wherein each of the first row decoder sub-circuits of the memory array comprises a voltage pump circuit having an input at which the block enable signal is applied, the voltage pump circuit configured to generate drive signals for the word line driver circuits responsive to the block enable signal.

15. The non-volatile memory device of claim 14 wherein each of the second row decoder sub-circuits of the memory array further comprises a voltage pump circuit pre-stage coupled to the block enable logic and configured to generate a periodic pump signal responsive to the block enable signal and wherein the voltage pump circuit comprises a voltage pump configured to generate the drive signal responsive the periodic pump signal.

16. The non-volatile memory device of claim 14 wherein each word line driver circuit of the memory array comprises N switches coupled to N global word lines and N word lines of the first and second pluralities of word lines, each of the N switches having a control node coupled to the drive signal and configured to couple the respective global word line to the respective word line responsive to the drive signal.

17. A method for arranging a memory array for a NAND flash non-volatile memory, the method comprising:

dividing the memory array into at least two memory sub-arrays, each memory sub-array having memory cells arranged in a NAND flash memory architecture with word lines and bit lines corresponding to rows and columns of memory;

separating a first and a second memory sub-array by a first region in which drive circuits coupled to the word lines of the first and second memory sub-arrays, the drive circuits driving selected word lines of the first and second memory sub-arrays responsive to selection by the first row decoder sub-circuits;

locating first row decoder sub-circuits in a second region separated from the first region by at least one of the memory sub-arrays, the row decoder circuits coupled to a respective one of the drive circuits located in the first region to select the respective drive circuit in response to decoding a memory address identifying a corresponding row decoder circuit; and locating second row decoder sub-circuits in the first region, the second row decoder sub-circuits coupled to a respective drive circuit in the first region and a respective first row decoder sub-circuit located in the second region, and selecting a first row decoder sub-circuit in response to decoding address signals, the first row decoder sub-circuit enabling a respective second row decoder sub-circuit to activate a respective drive circuit to drive the word lines coupled to the activated drive circuit.

18. The method of claim 17, further comprising coupling the first and second row decoder sub-circuits through conductive signal lines extending across the memory sub-array separating the second region from the first region.

19. The method of claim 17, further comprising providing global word lines coupled to the drive circuits formed in the first region to supply drive voltage for driving the selected word lines.

20. The method of claim 17 wherein dividing the memory array into at least two memory sub-arrays comprises separating the memory array into two memory sub-arrays, each memory sub-array having approximately the same number of word lines and bit lines.

21. The method of claim 17, further comprising coupling each drive circuit located in the first region to at least one word line of the first memory sub-array and to at least one word line of the second memory sub-array.

* * * * *